United States Patent
Yao et al.

(10) Patent No.: US 12,334,354 B2
(45) Date of Patent: Jun. 17, 2025

(54) SIDEWALL PASSIVATION FOR PLASMA ETCHING

(71) Applicant: Applied Materials, Inc., Santa Clara, CA (US)

(72) Inventors: Zhonghua Yao, Santa Clara, CA (US); Qian Fu, Pleasanton, CA (US); Aaron Eppler, Los Gatos, CA (US); Mukund Srinivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 598 days.

(21) Appl. No.: 17/590,084

(22) Filed: Feb. 1, 2022

(65) Prior Publication Data
US 2023/0245895 A1    Aug. 3, 2023

(51) Int. Cl.
H01L 21/3065    (2006.01)
H01L 21/02    (2006.01)

(52) U.S. Cl.
CPC .... *H01L 21/3065* (2013.01); *H01L 21/02129* (2013.01); *H01L 21/02205* (2013.01)

(58) Field of Classification Search
None
See application file for complete search history.

(56) References Cited

U.S. PATENT DOCUMENTS

| | | | |
|---|---|---|---|
| 2003/0215962 A1 | 11/2003 | Hausmann et al. | |
| 2009/0081879 A1* | 3/2009 | Sukekawa ......... | H01L 21/31116 438/735 |
| 2016/0260620 A1* | 9/2016 | Briggs .............. | H01J 37/32091 |
| 2016/0314981 A1 | 10/2016 | Yoon et al. | |
| 2017/0207088 A1* | 7/2017 | Kwon ................. | H01L 21/0335 |
| 2019/0362984 A1 | 11/2019 | Katsunuma | |
| 2021/0287908 A1 | 9/2021 | Tsai et al. | |
| 2021/0384038 A1 | 12/2021 | Uda | |

FOREIGN PATENT DOCUMENTS

WO    2021-003224 A1    1/2021

OTHER PUBLICATIONS

Application No. PCT/US2023/011474, International Search Report and the Written Opinion, Mailed On May 19, 2023, 10 pages.

\* cited by examiner

*Primary Examiner* — Stephanie P Duclair
(74) *Attorney, Agent, or Firm* — Kilpatrick Townsend & Stockton LLP (57) ABSTRACT

Exemplary semiconductor processing methods may include depositing a boron-containing material on the substrate. The boron-containing material may extend along sidewalls of the one or more features in the substrate. The methods may include forming a plasma of an oxygen-containing precursor and contacting the substrate with plasma effluents of the oxygen-containing precursor. The contacting may etch a portion of the one or more features in the substrate. The contacting may oxidize the boron-containing material.

19 Claims, 4 Drawing Sheets

SIDEWALL PASSIVATION FOR PLASMA ETCHING

TECHNICAL FIELD

The present technology relates to semiconductor systems, processes, and equipment. More specifically, the present technology relates to processes and systems to passivate sidewalls and maintain feature dimensions during etching operations.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in recessed features in the materials that may have uneven, or tapered, sidewalls. Developing materials with vertical features without any undercut may become more difficult.

Thus, there is a need for improved systems and methods that can be used to produce high quality devices and structures. These and other needs are addressed by the present technology.

SUMMARY

Exemplary semiconductor processing methods may include depositing a boron-containing material on the substrate. The boron-containing material may extend along sidewalls of the one or more features in the substrate. The methods may include forming a plasma of an oxygen-containing precursor and contacting the substrate with plasma effluents of the oxygen-containing precursor. The contacting may etch a portion of the one or more features in the substrate. The contacting may oxidize the boron-containing material.

In some embodiments, the oxygen-containing precursor may be or include diatomic oxygen. A temperature may be maintained at less than or about 50° C. while contacting the substrate with plasma effluents of the oxygen-containing precursor and while depositing the boron-containing material on the substrate. A pressure may be maintained between about 5 mTorr and about 100 mTorr while contacting the substrate with plasma effluents of the oxygen-containing precursor and while depositing the boron-containing material on the substrate. The methods may include forming a plasma of a boron-containing precursor. The plasma of the oxygen-containing precursor may be generated at a plasma power of greater than or about 3,000 W. The methods may include depositing a second amount of boron-containing material on the substrate. The second amount of boron-containing material may extend further along sidewalls of the one or features in the substrate. The methods may include providing a boron-containing precursor. The boron-containing precursor may be or include boron trichloride. A carbon-containing mask may be disposed along at least a portion of the substrate. The methods may include providing a fluorine-containing precursor. The methods may include treating a silicon-containing material disposed along at least a portion of the substrate with the fluorine-containing precursor. Treating the silicon-containing material with the fluorine-containing precursor may maintain openings defined in the silicon-containing material. The fluorine-containing precursor may be or include an organohalide.

Some embodiments of the present technology encompass semiconductor processing methods. The methods may include i) etching one or more features in a substrate disposed within a processing region of a semiconductor processing chamber with plasma effluents of an oxygen-containing precursor. The methods may include ii) depositing a boron-containing material on the substrate. The boron-containing material may extend along at least a portion of the one or more features in the substrate. The methods may include repeating operations i and ii to iteratively etch the one or more features in the substrate. A temperature within the semiconductor processing chamber may be maintained at less than or about 50° C. while performing operations i and ii.

In some embodiments, the boron-containing material may include a boron- and oxygen-containing material. A silicon-containing material may be formed along at least a portion of the substrate during the etching. The methods may include iii) treating the silicon-containing material with a fluorine-containing precursor. Treating the silicon-containing material with the fluorine-containing precursor may maintain openings defined in the substrate. Operations i) through iii) may be repeated at least three times. The boron-containing material may be deposited for a total period of time of less than or about 60 seconds.

Some embodiments of the present technology encompass semiconductor processing methods. The methods may include flowing an oxygen-containing precursor to a processing region of a semiconductor processing chamber. The oxygen-containing precursor may be or include diatomic oxygen. A substrate may be disposed within the processing region of the semiconductor processing chamber. The methods may include forming a plasma of the oxygen-containing precursor within the processing region. The methods may include contacting the substrate with plasma effluents of the oxygen-containing precursor. The contacting may etch a first portion of one or more features in the substrate. The methods may include flowing a boron-containing precursor to the processing region of the semiconductor processing chamber. The methods may include depositing a boron-containing material on a substrate. The boron-containing material may extend along at least a portion of one or features in the substrate. The boron-containing material may include oxygen. The methods may include flowing an oxygen-containing precursor to the processing region of the semiconductor processing chamber. The methods may include forming a plasma of the oxygen-containing precursor within the processing region. The methods may include contacting the substrate with plasma effluents of the oxygen-containing precursor. The contacting may etch a second portion of the one or more features in the substrate. The contacting may oxidize the boron-containing material.

In some embodiments, a flow rate of the boron-containing precursor may be between about 50 sccm and about 500 sccm. The boron-containing precursor may be flowed to the processing region of the semiconductor processing chamber without a carrier gas. The methods may include forming a plasma of the boron-containing precursor. The plasma of the oxygen-containing precursor may be generated at a higher plasma power than the plasma of the boron-containing precursor. The methods may include providing a fluorine-containing precursor to the processing region of the semiconductor processing chamber. The fluorine-containing precursor may include carbon. The methods may include treating a silicon-containing mask disposed along at least a portion of the substrate with the fluorine-containing precursor. Treating the silicon-containing mask with the fluorine-containing precursor may maintain openings defined in the silicon-containing mask.

Such technology may provide numerous benefits over conventional methods and techniques. For example, the processes may passivate sidewalls of the features being formed, while allowing the substrate to be maintained in a single processing chamber. Additionally, the processes may uniformly etch the features by maintaining feature dimensions, which may allow deeper and more uniform features to be produced. The formation of the passivation material may be quicker than conventional atomic layer deposition (ALD) allowing for better throughput and single-chamber processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features inside semiconductor structures may be reduced in size, and aspect ratios of the features may increase. As the aspect ratios of the features increase, etching operations may struggle to uniformly etch features without tapering the sidewalls of the feature, or compromising feature dimensions or integrity.

Conventional technologies have used ALD to intermittently deposit a thin protective layer of material on the sidewalls of features during etching processes. However, these ALD operations require significant time to form the feature, which increases queue time and reduces throughput. Further, the introduction of a layer of material formed using ALD may require additional hardware on a chamber to provide various precursors or may require breaking vacuum and transferring the structure to another chamber to perform the deposition via ALD. Not only does this transfer increase queue time and reduce throughput, but it also may allow for undesirable contamination or atmospheric exposure during processing. Accordingly, many conventional technologies have been limited in the ability to prevent structural flaws in the final devices.

The present technology overcomes these issues by providing a deposition precursor to form a passivation material that serves to coat the sidewalls of the features during etching operations. The deposition process may be performed in the same chamber as the etch process, which may limit queue times and increase throughput. By providing the passivation material, the present technology may continue to etch the feature while protecting the feature dimensions and limiting etching the sidewalls towards the top of the feature, such that the sidewalls become tapered or undercut an overlying material expanding feature dimensions. By depositing the passivation layer, the present technology may prevent problems in any following integration processes due to pitch loss and/or defects in the final devices.

Although the remaining disclosure will routinely identify specific etching and depositing processes utilizing the disclosed technology, it will be readily understood that the systems and methods are equally applicable to a variety of other processes as may occur in the described chambers. Accordingly, the technology should not be considered to be so limited as for use with the described etching or depositing processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

Figure 1:
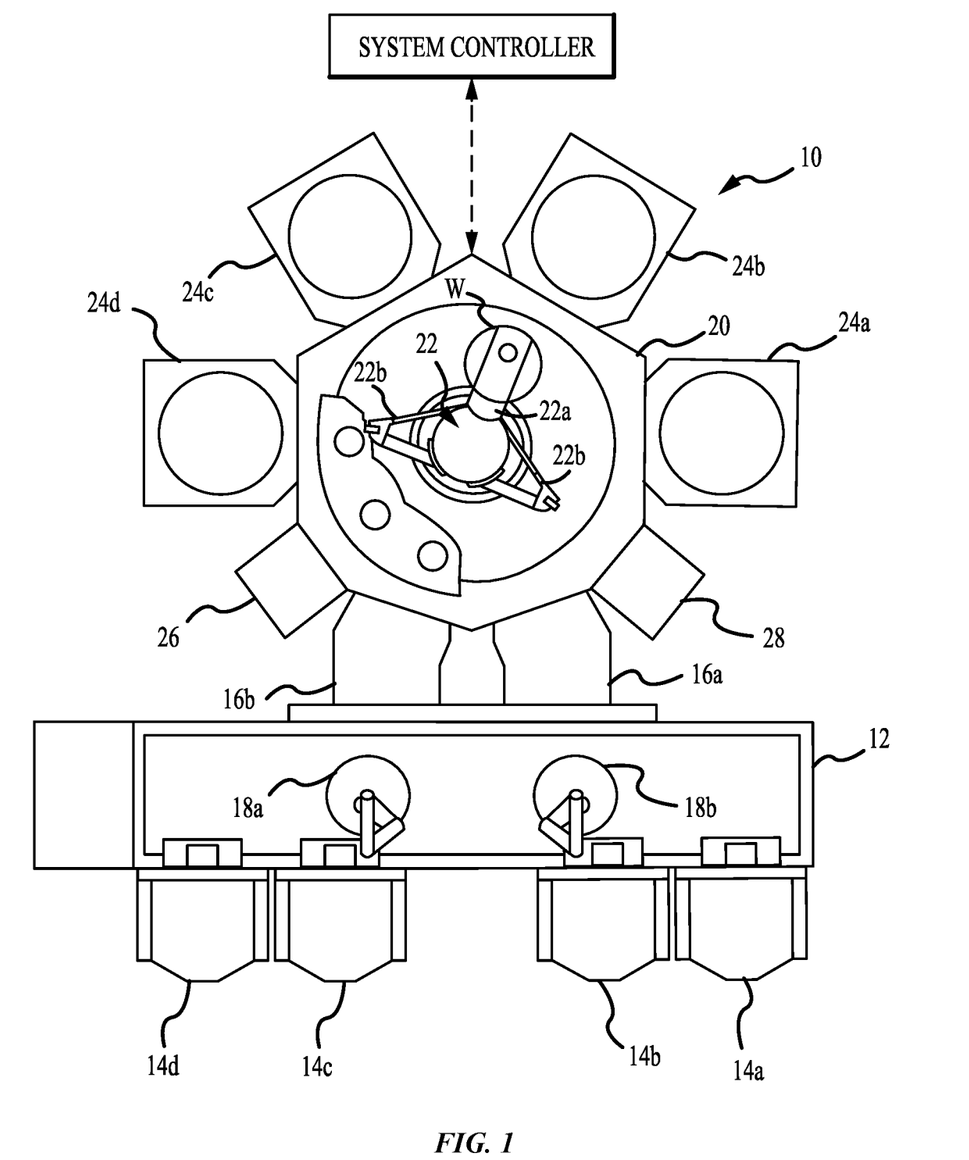
FIG. 1 shows a schematic top plan view of an exemplary processing system according to some embodiments of the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
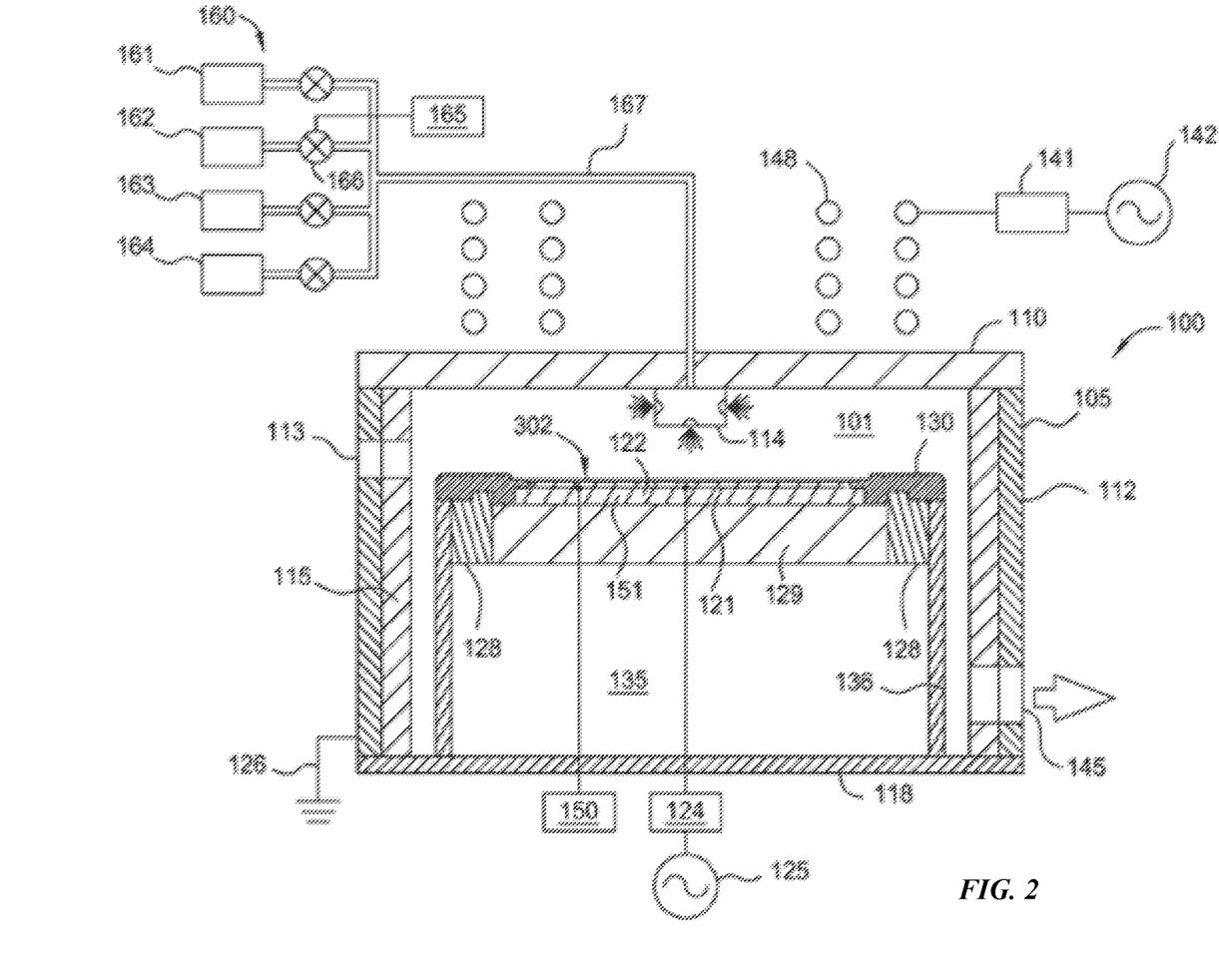
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
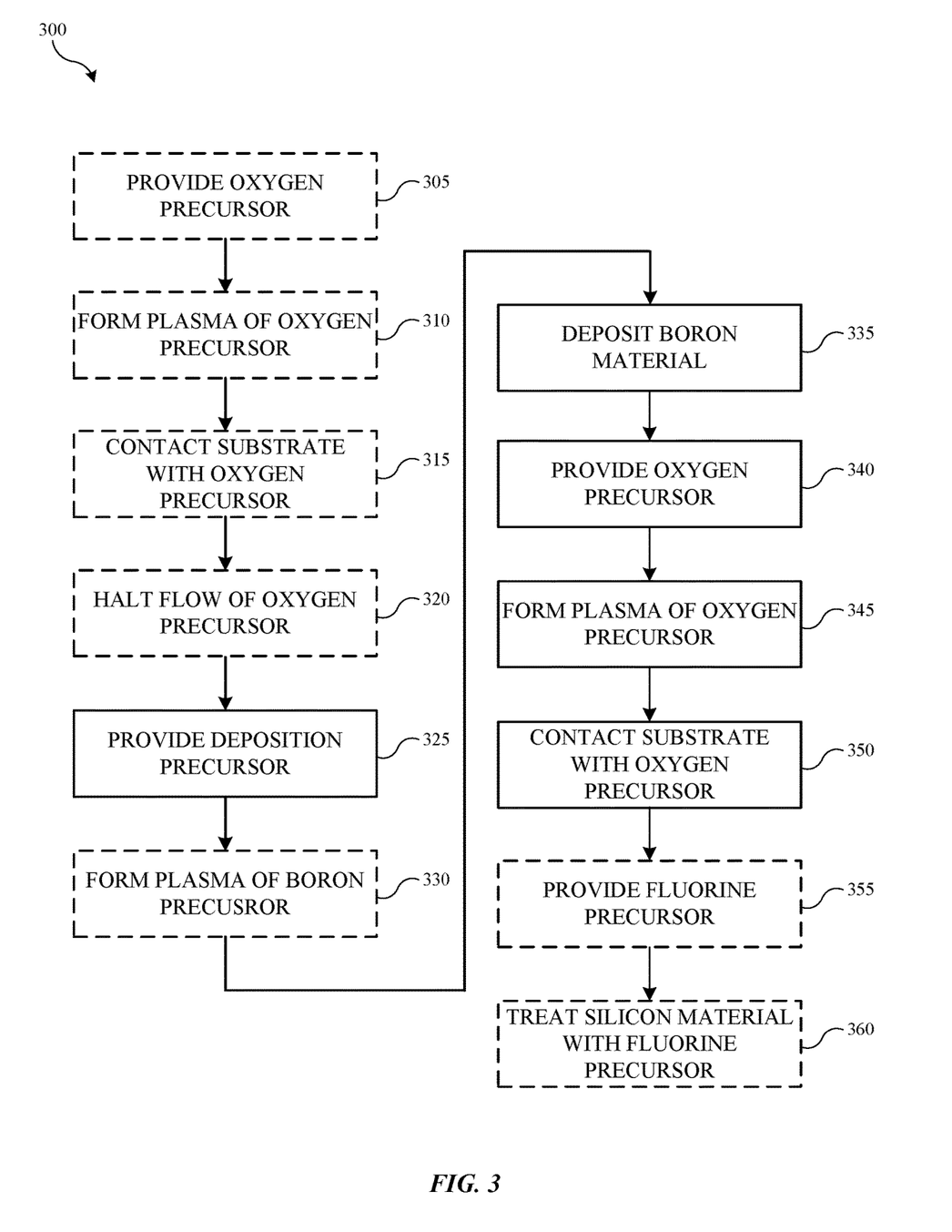
FIG. 3 shows selected operations in a semiconductor processing method according to some embodiments of the present technology.

The processing chambers described above may be used during methods according to embodiments of the present technology. FIG. 3 illustrates a method 300 of semiconductor processing, operations of which may be performed, for example, in one or more chambers 100 incorporated on multi-chamber processing system 10 as previously described. Any other chamber may also be utilized, which may perform one or more operations of any method or process described. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may include a number of operations that may be performed in a number of variations, such as including beginning at different operations of processing. Method 300 may generally include an etching operation that may occur in chambers in which deposition processes may be performed. Often, the deposition may be performed subsequent to or during the etching. Accordingly, although method 300 will be described in a particular order, it is to be understood that the method may be performed in a number of different variations according to embodiments of the present technology. Method 300 may describe operations shown schematically in FIGS. 4A-4D, the illustrations of which will be described in conjunction with the operations of method 300. It is to be understood that structure 400 in FIGS. 4A-4D illustrates only partial schematic views, and a substrate 405 may contain any number of structural sections having aspects as illustrated in the figures, as well as alternative structural aspects that may still benefit from operations of the present technology.

Figure 4A:
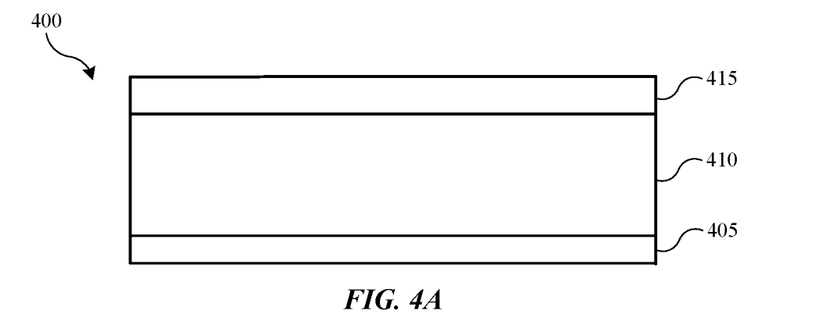
FIGS. 4A-4D show exemplary schematic cross-sectional structures in which material layers are included and produced according to some embodiments of the present technology.

As illustrated in FIG. 4A, the structure 400 may include a substrate 405. Substrate 405 may have a substantially planar surface or an uneven surface in embodiments. The substrate 405 may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. The substrate 405 may have various dimensions, such as 200 mm or 300 mm diameter wafers, as well as rectangular or square panels. Substrate 405 may be disposed within the processing region of the semiconductor processing chamber. Although shown as a planar substrate, it is to be understood that substrate 405 is included merely to represent an underlying structure, which may include any number of layers or features on a wafer or other substrate, and over which a mask as described below may be formed.

The substrate 405 may include a carbon-containing mask 410. The carbon-containing mask 410 may be disposed along at least a portion or all of the substrate 405. The carbon-containing mask 410 may be or include a carbon hard mask or any other carbon-containing mask material. In some embodiments to facilitate patterning of the carbon-containing mask, a silicon-containing material 415, photoresist, or any other mask material, may be disposed along the carbon-containing mask 410. The silicon-containing material 415 may be or include crystalline silicon, amorphous silicon, silicon carbide, silicon oxide, silicon nitride, or any other silicon material.

Figure 4B:
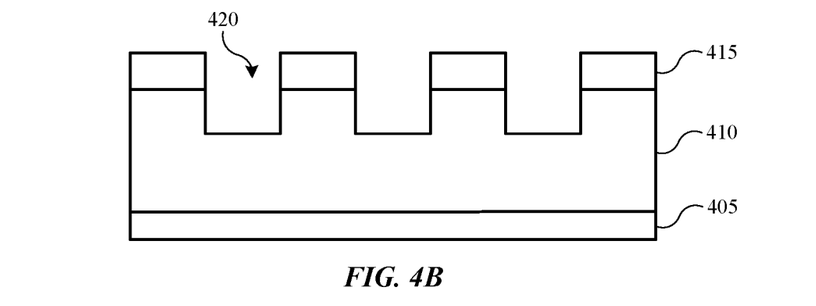

As shown in FIG. 4B, a pattern may be etched or formed into the silicon-containing material 415. Although material 415 will be termed silicon-containing, it is to be understood that any mask material as noted above may be used to pattern carbon-containing mask 410 according to embodiments of the present technology. The pattern may be etched into the silicon-containing material 415 using any etching processes and any etching reagents. The pattern in the silicon-containing material 415 may form features or gaps in the silicon-containing material 415. The pattern may extend all the way through a thickness of the silicon-containing material 415 such that the carbon-containing mask 410 is at least partially exposed.

At operation 305, the method 300 may include providing, or flowing, an oxygen-containing precursor to a processing region of a semiconductor processing chamber. Oxygen-containing precursors that may be used in operation 305 may be or include any number of oxygen-containing precursors. For example, any oxygen-containing precursor for etching carbon material to produce volatiles, such as carbon dioxide volatiles, may be used. As non-limiting examples, in embodiments of the present technology the oxygen-containing precursor may be or include diatomic oxygen, ozone, nitrous oxide, nitric oxide, sulfur dioxide or any other oxygen-containing precursors. In embodiments, an additional source of oxygen may be provided along with the oxygen-containing precursor. For example, diatomic oxygen may be provided with one or more other oxygen-containing precursors.

Once the oxygen-containing precursor or precursors are provided to the processing region, the method 300 may include forming a plasma of the oxygen-containing precursor within the processing region at operation 310. The plasma of the oxygen-containing precursor may be generated at a plasma power of greater than or about 2,000 W, and may be generated at a plasma power greater than or about 2,250 W, greater than or about 2,500 W, greater than or about 2,750 W, greater than or about 3,000 W, greater than or about 3,250 W, greater than or about 3,500 W, greater than or about 3,750 W, greater than or about 4,000 W, greater than or about 4,250 W, greater than or about 4,500 W, greater than or about 4,750 W, greater than or about 5,000 W, or more. In embodiments, the plasma of the oxygen-containing precursor may be generated at a plasma power of greater than or about 6,000 W, and may be generated at a plasma power less than or about 5,750 W, less than or about 5,500 W, less than or about 5,250 W, less than or about 5,000 W, or less. A plasma power, including both source and bias power, of greater than or about 3,000 W may increase directionality of delivery of the oxygen-containing precursor. This directionality may increase the vertical etching performing a more anisotropic etch of the substrate 405 or the carbon-containing mask 410, when present, to create features 420 with high aspect ratios, as will be described below.

Still referring to FIG. 4B, at operation 315, the method 300 may include contacting the substrate 405 or the carbon-containing mask 410, when present, with plasma effluents of the oxygen-containing precursor. The contacting may etch a first portion of one or more features 420 in the substrate 405 or the carbon-containing mask 410. Any variety of etching process may be utilized to etch material from the substrate 405 or the carbon-containing mask 410. The oxygen-containing precursor and substrate 405 or the carbon-containing mask 410 may react to form volatiles, such as carbon dioxide, that may be subsequently purged from the semiconductor processing chamber. The oxygen-containing precursor may not etch the silicon-containing material 415. While some of the oxygen-containing precursor may react with the silicon-containing material 415 and oxidize the silicon-containing material 415. Additionally, ionic interaction may cause an amount of sputtering of the silicon-containing material, which may re-deposit as silicon or oxidized material, and which can form along the opening of the feature 420 being etched.

The first portion of the features 420 may extend into the substrate 405 or the carbon-containing mask 410 a distance less than a complete thickness of the film. After the first portion of the features 420 are etched, a passivation layer may be formed over the substrate or the carbon-containing mask 410. The passivation layer may serve to protect the underlying substrate 405 or the carbon-containing mask 410 from subsequent etching operations such that continued exposure and etching of the sidewalls of the substrate 405 or the carbon-containing mask 410 may be limited, which may help retain a substantially vertical shape as higher aspect-ratio features are formed. As used herein, "substantially vertical" may mean within 10° of vertical. For example, the present technology may facilitate improved feature integrity for high aspect ratio formation, and may improve sidewall profiles for features characterized by an aspect ratio, such as a height-to-width ratio, of greater than or about 2:1, and which may be characterized by an aspect ratio of greater than or about 3:1, greater than or about 4:1, greater than or about 5:1, greater than or about 8:1, greater than or about 10:1, greater than or about 15:1, greater than or about 20:1, greater than or about 25:1, or more. In embodiments, the first portion of the features 420, as illustrated in FIG. 4B, may extend less than or about 1 μm into the substrate 405 or the carbon-containing mask 410, and may extend less than or about 0.9 μm, less than or about 0.8 μm, less than or about 0.7 μm, less than or about 0.6 μm, less than or about 0.5 μm, or less. The first portion of the features 420 may be less than or about 40% of a total depth of the features 420 to be formed, and may be less than or about 35% of the desired feature depth, less than or about 30%, less than or about 25%, less than or about 20%, less than or about 10%, or less. If the first portion of the features 420 extends greater than 1 μm or greater than 40% of the total depth of the features 420, the sidewalls of the feature may continue to be etched by the plasma effluents of the oxygen-containing plasma and may not retain a substantially vertical profile.

At optional operation 320, the method 300 may include halting a flow of the oxygen-containing precursor. In embodiments, the method 300 may alternatively include reducing the flow rate of the oxygen-containing precursor. If the flow rate of the oxygen-containing precursor is not reduced or halted, it may begin to interact with other precursors, such as a boron or other deposition compound, in the processing region prior to reaching the substrate 405, as described in subsequent operations. In the case of a boron compound being provided after the oxygen-containing precursor, the oxygen-containing precursor may begin to dissociate the boron compound and form undesirable intermediates or by-products prior to the boron compound reaching the substrate 405.

The method 300 may include providing a deposition precursor at operation 325. Although any number of deposition precursors may be used, in some embodiments of the present technology, the deposition precursors may be characterized by an ability to interact with residual oxygen. For example, as the previously discussed etch process proceeds, oxygen may be incorporated within the substrate 405 or the carbon-containing mask 410, and may saturate exposed surfaces. Deposition precursors may be characterized by an ability to readily interact with residual oxygen and form materials along exposed surfaces of the carbon mask. For example, materials may be or include Lewis acids or other acceptor materials or radicals, which may more readily allow or form coupling with charged oxygen species, and form surface layers along the sidewalls of the features being formed. It is to be understood that any Lewis acid material, such as including aluminum-containing materials or boron-containing materials, may be used in embodiments of the present technology. In some embodiments, boron-containing materials may be used, which may limit conductive formation or other interactions that may alter characteristics of the structure being formed.

Boron-containing precursors that may be used in operation 310 may be or include any number of boron-containing precursors, including any boron-containing Lewis acid. In embodiments, the boron-containing precursor may be or include boron trichloride ($BCl_3$), boron tribromide ($BBr_3$), boron trifluoride ($BF_3$), or combinations of these. A flow rate of the boron-containing precursor may be greater than or about 50 sccm, and may be greater than or about 60 sccm, greater than or about 70 sccm, greater than or about 80 sccm, greater than or about 90 sccm, greater than or about 100 sccm, greater than or about 110 sccm, greater than or about 120 sccm, greater than or about 130 sccm, greater than or about 140 sccm, greater than or about 150 sccm, greater than or about 160 sccm, greater than or about 170 sccm, greater than or about 180 sccm, greater than or about 190 sccm, or higher. In embodiments, the flow rate of the boron-containing precursor may be between about 50 sccm and about 500 sccm. The flow rate of the boron-containing precursor may be tailored depending on the rate of the growth desired. Further, the flow rate of the boron-containing precursor may be tailored depending on the aspect ratios of the features 420. With higher aspect ratio features 420, the flow rate may be higher, whereas the flow rate may be lower with features 420 with lower aspect ratios. In some embodiments, carrier gases may not be used to deliver the boron-containing precursor.

At operation 330, the method 300 may or may not include forming a plasma of the boron-containing precursor within the processing region. The plasma of the boron-containing precursor may be generated at a plasma power of less than or about 2,500 W, and may be generated at a plasma power less than or about 2,250 W, less than or about 2,000 W, less than or about 1,750 W, less than or about 1,500 W, less than or about 1,250 W, less than or about 1,000 W, less than or about 750 W, less than or about 500 W, less than or about 250 W, or less. Plasma power of greater than or 2,500 W may increase ionic interactions causing more scattering and removal of the material being deposited. At plasma powers less than or about 2,500 W, scattering may be reduced or limited, which may result in a conformal deposition of a boron material, as described below, on the features 420. Compared to the etching operation, the plasma of the oxygen-containing precursor may be generated at a higher plasma power than the plasma of the boron-containing precursor. The higher etching plasma power may facilitate delivery through the high aspect ratio features in some embodiments, and may increase physical interactions with materials to improve etching.

Figure 4C:
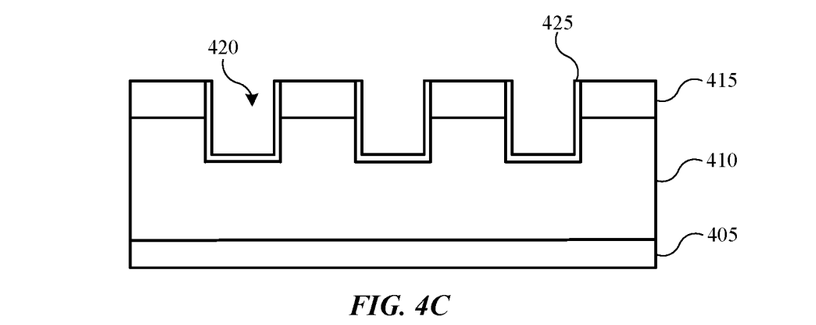

As shown in FIG. 4C, the method 300 may include depositing a boron-containing material 425 at operation 335. The boron-containing material 425 may extend along at least a portion of the one or more features 420 in the substrate 405 or the carbon-containing mask 410.

The boron-containing material 425 may be conformally deposited along the sidewalls and bottoms of the features 420. As explained above, the boron-containing precursor may associate with residual oxygen retained from the etching at operation 315. The boron-containing material 425 may be a boron-and-oxygen containing material. For example, when the boron-containing precursor is a Lewis acid, the plasma effluents of the boron-containing precursor may more readily interact with the residual oxygen and form the boron-containing material 425 on the substrate 405 or the carbon-containing mask 410. In embodiments, it is contemplated that additional oxygen, such as diatomic oxygen, may be provided to the processing region at operation 335 if sufficient residual oxygen is not present on the substrate 405 or the carbon-containing mask 410 in the features 420 for a boron-containing material 425 to be formed.

Plasma effluents of the boron-containing precursor may be deposited on the substrate 405 or the carbon-containing mask 410 for a period of time of less than or about 60 seconds. At periods of time of greater than 60 seconds, a thickness of the boron-containing material may increase, and may cause alterations to material performance, and may frustrate subsequent etching operations to further increase a depth of the feature through the base portion of the deposited material. Accordingly, plasma effluents of the boron-containing precursor may be deposited on the substrate 405 or the carbon-containing mask 410 for a period of time of less than or about 50 seconds, less than or about 40 seconds, less than or about 35 seconds, less than or about 30 seconds, less than or about 25 seconds, less than or about 20 seconds, less than or about 15 seconds, less than or about 10 seconds, or less. In embodiments where the method 300 includes iteratively depositing the boron-containing material 425, as will be described below, the total amount of time of depositing the material may be less than or about 60 seconds, or for shorter periods of times as described above.

The boron-containing precursor may be flowed to the processing region of the semiconductor processing chamber without a carrier gas. A carrier gas may increase dissociation of the boron-containing precursor prior to the boron-containing precursor being able to react with the residual oxygen from the etching at operation 315. If the boron-containing precursor is caused to excessively dissociate prior to reacting with the residual oxygen on the substrate 405 or the carbon-containing mask 410, a boron-containing material 425 may not be formed on the substrate 405 or the carbon-containing mask 410, and detrimental etchant byproducts may be formed. For example, if the boron-containing precursor, such a $BCl_3$, is provided with an argon or nitrogen carrier gas, the $BCl_3$ may more fully dissociate and the resultant chloride ions may undesirably etch the substrate 405 or the carbon-containing mask 410 and/or the silicon-containing material 415, as well as any other layers present on the substrate 405. While a plasma power of less than 2,500 W, as detailed above, may dissociate the boron-containing precursor prior to reacting with the residual oxygen, the rate of dissociation may be insufficient to inhibit growth of the boron-containing material 425.

In embodiments, the method 300 may include reducing a pressure within the semiconductor processing chamber while depositing the boron-containing material 425 on the substrate 405. This reduction in pressure, along with the reduced plasma power, may improve delivery of the plasma effluents of the boron-containing precursor and, therefore, increase the conformality of the deposition in the features 420. The entire process may be performed at processing pressures of less than or about 100 mTorr, and may be performed at pressures of less than or about 80 mTorr, less than or about 50 mTorr, less than or about 40 mTorr, less than or about 30 mTorr, less than or about 20 mTorr, less than or about 10 mTorr or less. Additionally, in some embodiments, the deposition may be performed at a pressure of at least about 2 mTorr less than the pressure during etching, and the deposition may be performed at a pressure of at least about 3 mTorr less than the pressure during the etching, at least about 4 mTorr less than the pressure during the etching, at least about 5 mTorr less than the pressure during the etching, at least about 6 mTorr less than the pressure during the etching, at least about 7 mTorr less than the pressure during the etching, at least about 8 mTorr less than the pressure during the etching, at least about 9 mTorr less than the pressure during the etching, at least about 10 mTorr less than the pressure during the etching, or more.

Figure 4D:
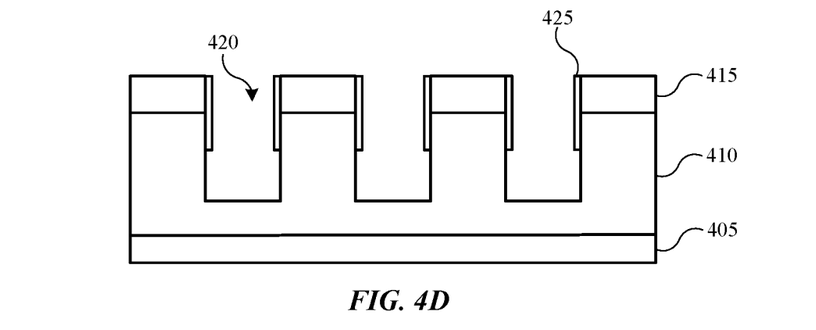

As shown in FIG. 4D, the method 300 may include etching a second portion of the features 420. This etch may remove the boron-containing material at the bottoms of the features 420 and continue etching the substrate 405 or the carbon-containing mask 410 below the boron-containing material 425 deposited on the sidewalls of the substrate 405 or the carbon-containing mask 410. At operation 340, the method 300 may include providing, or resuming a flow of, the oxygen-containing precursor. Operation 340 may be performed the same as or similar to operation 305. The method 300 may include forming a plasma of the oxygen containing precursor at operation 345. Operation 345 may be performed the same as or similar to operation 310. The method 300 may include contacting the substrate 405 or the carbon-containing mask 410 with plasma effluents of the oxygen-containing precursor at operation 350. Operation 350 may be performed the same as or similar to operation 315. At operation 350, the contacting may etch the second portion of one or more features 420 in the substrate 405 or the carbon-containing mask 410. Etching the second portion of features 420 in the substrate 405 or the carbon-containing mask 410 may selectively remove material from the bottom of the boron-containing material 425 before further removing the second portion of the substrate 405 or the carbon-containing mask 410. By performing a biased etch, the bottom of the boron-containing material 425 may be removed due to the directionality of the plasma effluents of the oxygen-containing precursor without removing the sidewalls of the boron-containing material 425. A physical interaction or sputtering of the deposition material may readily remove the material based on the limited formation at the base of the features, and then continue the anisotropic etch. Similar to operation 315, any variety of etching process may be utilized to etch material from the bottom of the boron-containing material 425 and/or the substrate 405 or the carbon-containing mask 410, and may include a directional etch to remove material across the lower surface of the boron-containing material 425, while maintaining the boron-containing material 425 along sidewalls of the substrate 405 or the carbon-containing mask 410. Further, the boron-containing material 425 may protect the sidewalls of the substrate 405 or the carbon-containing mask 410 from further etching, as the boron-containing material 425 may serve as a passivation layer.

Subsequent to the etch process, the depth of the features 420 may be greater than or about 1.0 μm, greater than or about 1.5 μm, greater than or about 2.0 μm, greater than or about 2.5 μm, greater than or about 3.0 μm, greater than or about 3.5 μm, greater than or about 4.0 μm, or more. As aspect ratios increase, it may be more difficult to continuously etch features 420 into the substrate 405 or the carbon-containing mask 410 with a consistent diameter. That is, the substrate 405 or the carbon-containing mask 410 towards the top of the feature 420 may be etched at a greater rate than toward the bottom of the feature 420. This may result in non-uniformity in the feature 420. However, embodiments of the present technology may provide a passivation layer of boron-containing material 425 that may result in the features 420 being etched in a much more uniform fashion.

At optional operation 335, the method 300 may include providing, or flowing, a fluorine-containing precursor to the processing region of the semiconductor processing chamber. Fluorine-containing precursors that may be used in operation 355 may be or include any number of fluorine-containing precursors. For example, the fluorine-containing precursor may be or include an organohalide, such as hexafluorobutadiene ($C_4F_6$). In embodiments, a plasma of the fluorine-containing precursor may be formed in the processing region.

At optional operation 340, the method may include treating the silicon-containing material 415 disposed along at least a portion of the substrate 405 or the carbon-containing mask with the fluorine-containing precursor. Treating the silicon-containing material with the fluorine-containing precursor may maintain openings defined in the substrate 405 or the carbon-containing mask. During etching operations, the oxygen-containing precursor may react with the silicon-containing material 415. This reaction between the oxygen-containing precursor and the silicon-containing material 415 may result in formation of additional material, such as silicon oxide, within the features 420, as previously described. This formation of additional material may narrow the openings defined by the features 420 such that the underlying feature 420 becomes difficult to access during subsequent etching and/or deposition operations. Accordingly, the flashing at optional operation 340 may remove the additional material and may maintain the openings defined in the silicon-containing material 415.

The method 300 may include repeating the above operations to iteratively etch the features 420 and passivate the sidewalls of the substrate 405 or the carbon-containing mask 410 to increase uniformity in the features 420. For example, the method 300 may include iteratively etching, such as operations 305-315, and depositing a passivation layer, such as operations 325-335. As the operations are repeated, additional material may narrow the openings defined by the features 420. Therefore, the method 300 may include intermittently repeating the flash procedure of operations 355-360. For example, the method 300 may include multiple loops or iterations of a first sequence including etching, depositing, etching, and flashing. Subsequent to sufficient deposition, or deposition to a sufficient depth, the method may proceed as a specific etch process, and may additionally include multiple loops or iterations of etching and flashing until the features have been formed to the desired depth. The method 300 may include any number of loops or iterations of either sequence and may include two loops, three loop, four loops, or more. Each loop may be the same order as the previous loop or may differ from the previous loop. For example, in some loops a flashing operation may not be needed.

During method 300 or any of operations 305-360, a temperature within the semiconductor processing chamber 100 such as a substrate support temperature, or a substrate temperature, may be maintained at less than or about 50° C. Accordingly, the temperature within the semiconductor processing chamber 100 may be maintained at less than or about 40° C., less than or about 30° C., less than or about 25° C., less than or about 10° C., less than or about 5° C., less than or about 0° C., less than or about −5° C., less than or about −10° C., less than or about −25° C., less than or about −30° C., less than or about −40° C., or lower. As operations 305-360 may be performed in a single chamber, such as semiconductor processing chamber 100, the temperature may be maintained throughout method 300 to increase throughput and reduce queue times. As temperature is decreased, the etch rate during etching operations may increase. To control the etch rate, the temperature may be maintained at greater than or about −50° C. Further, at lower temperatures, such as lower than or about 0° C., the boron-containing material 425 may serve as a stronger passivation layer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a carbon-containing precursor" includes a plurality of such precursors, and reference to "the carbon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
depositing a boron-containing material on a substrate, wherein a carbon-containing mask is disposed along at least a portion of the substrate, wherein a patterned silicon-containing material is disposed along the carbon-containing mask, and wherein the boron-containing material extends along sidewalls of one or more features in the carbon-containing mask;
forming a plasma of an oxygen-containing precursor; and
contacting the substrate with plasma effluents of the oxygen-containing precursor, wherein the contacting etches a portion of the one or more features in the carbon-containing mask, and wherein the contacting oxidizes the boron-containing material.

2. The semiconductor processing method of claim 1, wherein:
the oxygen-containing precursor comprises diatomic oxygen.

3. The semiconductor processing method of claim 1, wherein:
a temperature is maintained at less than or about 50° C. while contacting the substrate with plasma effluents of the oxygen-containing precursor and while depositing the boron-containing material on the substrate.

4. The semiconductor processing method of claim 1, wherein:
a pressure is maintained between about 5 mTorr and about 100 mTorr while contacting the substrate with plasma effluents of the oxygen-containing precursor and while depositing the boron-containing material on the substrate.

5. The semiconductor processing method of claim 1, further comprising:
forming a plasma of a boron-containing precursor.

6. The semiconductor processing method of claim 5, wherein:
the plasma of the oxygen-containing precursor is generated at a plasma power of greater than or about 3,000 W.

7. The semiconductor processing method of claim 1, further comprising:
depositing a second amount of boron-containing material on the substrate, wherein the second amount of boron-containing material extends further along sidewalls of the one or features in the carbon-containing mask.

8. The semiconductor processing method of claim 1, further comprising:

providing a boron-containing precursor, wherein the boron-containing precursor comprises boron trichloride.

9. The semiconductor processing method of claim 1, further comprising:
providing a fluorine-containing precursor; and
treating a silicon-containing material disposed along at least a portion of the substrate with the fluorine-containing precursor, wherein treating the silicon-containing material with the fluorine-containing precursor maintains openings defined in the silicon-containing material.

10. The semiconductor processing method of claim 9, wherein:
the fluorine-containing precursor comprises an organohalide.

11. A semiconductor processing method comprising:
i) etching one or more features in a substrate disposed within a processing region of a semiconductor processing chamber with plasma effluents of an oxygen-containing precursor;
ii) depositing a boron-containing material on the substrate, wherein the boron-containing material extends along at least a portion of the one or more features in the substrate; and
repeating operations i and ii to iteratively etch the one or more features in the substrate, wherein a temperature within the semiconductor processing chamber is maintained at less than or about −5° C. while performing operations i and ii.

12. The semiconductor processing method of claim 11, wherein:
the boron-containing material comprises a boron-and-oxygen-containing material.

13. The semiconductor processing method of claim 11, wherein:
a silicon-containing material is formed along at least a portion of the substrate during the etching; and
the method further comprises iii) treating the silicon-containing material with a fluorine-containing precursor, wherein treating the silicon-containing material with the fluorine-containing precursor maintains openings defined in the substrate.

14. The semiconductor processing method of claim 13, wherein:
operations i) through iii) are repeated at least three times, and wherein the boron-containing material is deposited for a total period of time of less than or about 60 seconds.

15. A semiconductor processing method comprising:
flowing an oxygen-containing precursor to a processing region of a semiconductor processing chamber, wherein the oxygen-containing precursor comprises diatomic oxygen, wherein a substrate is disposed within the processing region of the semiconductor processing chamber;
forming a plasma of the oxygen-containing precursor within the processing region;
contacting the substrate with plasma effluents of the oxygen-containing precursor, wherein the contacting etches a first portion of one or more features in the substrate;
flowing a boron-containing precursor to the processing region of the semiconductor processing chamber;
depositing a boron-containing material on a substrate, wherein the boron-containing material extends along at least a portion of one or more features in the substrate, and wherein the boron-containing material comprises oxygen;
flowing an oxygen-containing precursor to the processing region of the semiconductor processing chamber;
forming a plasma of the oxygen-containing precursor within the processing region; and
contacting the substrate with plasma effluents of the oxygen-containing precursor, wherein the contacting etches a second portion of the one or more features in the substrate, and wherein the contacting oxidizes the boron-containing material, wherein a temperature within the semiconductor processing chamber is maintained at less than or about −5° C.

16. The semiconductor processing method of claim 15, wherein:
a flow rate of the boron-containing precursor is between about 50 sccm and about 500 sccm.

17. The semiconductor processing method of claim 15, wherein:
the boron-containing precursor is flowed to the processing region of the semiconductor processing chamber without a carrier gas.

18. The semiconductor processing method of claim 15, further comprising:
forming a plasma of the boron-containing precursor, wherein the plasma of the oxygen-containing precursor is generated at a higher plasma power than the plasma of the boron-containing precursor.

19. The semiconductor processing method of claim 15, further comprising:
providing a fluorine-containing precursor to the processing region of the semiconductor processing chamber, wherein the fluorine-containing precursor comprises carbon; and
treating a silicon-containing mask disposed along at least a portion of the substrate with the fluorine-containing precursor, wherein treating the silicon-containing mask with the fluorine-containing precursor maintains openings defined in the silicon-containing mask.

* * * * *